United States Patent
Wang et al.

(10) Patent No.: US 7,796,249 B2
(45) Date of Patent: Sep. 14, 2010

(54) MASK HAZE EARLY DETECTION

(75) Inventors: Wen-Chuan Wang, Hsinchu (TW); Shy-Jay Lin, Hsinchu County (TW); Te-Chih Huang, Chu-Bei, Shin-Chu County (TW); Chih-Ming Ke, Hsinchu (TW); Wei-Yu Su, Banciao, Taipei County (TW); Heng-Hsin Liu, Yonghe, Taipei County (TW); Tsai-Sheng Gau, Hsinchu (TW); Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 392 days.

(21) Appl. No.: 11/866,514

(22) Filed: Oct. 3, 2007

(65) Prior Publication Data

US 2009/0063074 A1 Mar. 5, 2009

Related U.S. Application Data

(60) Provisional application No. 60/969,368, filed on Aug. 31, 2007.

(51) Int. Cl.
 *G01N 21/00* (2006.01)
(52) U.S. Cl. .................................. 356/237.2; 356/237.1
(58) Field of Classification Search .... 356/237.1–237.5
 See application file for complete search history.

(56) References Cited

U.S. PATENT DOCUMENTS

| | | | | |
|---|---|---|---|---|
| 5,940,175 A | * | 8/1999 | Sun | 356/237.3 |
| 6,157,444 A | * | 12/2000 | Tomita et al. | 356/237.1 |
| 6,809,809 B2 | | 10/2004 | Kinney et al. | |
| 6,862,096 B2 | * | 3/2005 | Vaez-Iravani et al. | 356/600 |
| 7,068,363 B2 | | 6/2006 | Bevis et al. | |
| 7,102,744 B2 | | 9/2006 | Marxer et al. | |
| 7,486,391 B2 | * | 2/2009 | Chen et al. | 356/237.1 |
| 2005/0018181 A1 | * | 1/2005 | Vaez-Iravani et al. | 356/237.1 |
| 2007/0039631 A1 | | 2/2007 | Hsia et al. | |
| 2007/0075037 A1 | | 4/2007 | Chang et al. | |
| 2007/0087571 A1 | | 4/2007 | Chang et al. | |
| 2008/0062414 A1 | * | 3/2008 | Chen et al. | 356/237.1 |

OTHER PUBLICATIONS

TeraStar, "Reticle Inspection System", KLA Tencor, 2 pages.
TeraSlim, Advanced Reticle Defect Printability Simulation, KLA Tencor, 2 pages.
TeraScanHR, "Reticle Inspection System: High-Resolution, Die-to-Database Reticle Inspection For 45nm Production", KLA Tencor, 4 pages.
Hiroyuki Ishii et al., "Root Cause Analysis For Crystal Growth at ArF Excimer Laser Lithography", Photomask and Next-Generation Lithography Mask Technology XI, edited by Hiroyoshi Tanabe, Proceedings of SPIE vol. 5446 (SPIE, Bellingham, WA), pp. 218-224.
Eric V. Johnstone et al., "193nm Haze Contamination: A Close Relationship Between Mask and Its Environment", Proceedings of SPIE vol. 5256, 23rd Annual BACUS Symposium on Photomask Technology, pp. 440-448.

(Continued)

*Primary Examiner*—Michael P Stafira
(74) *Attorney, Agent, or Firm*—Haynes and Boone, LLP

(57) ABSTRACT

Detecting haze formation on a mask by obtaining an optical property of the mask and determining progress of the haze formation based on the obtained optical property.

20 Claims, 6 Drawing Sheets

OTHER PUBLICATIONS

Brian J. Grenon et al., "Reticle Surface Contaminants and Their Relationship To Sub-Pellicle Particle Formation", 9 pages.

Kaustuve Bhattacharyya et al., "Investigation of Reticle Defect Formation at DUV Lithography", 10 pages.

William Broadbent et al., "Field Result From A New Die-To-Database Reticle Inspection Platform", 2007 Society of Photo-Optical Instrumentation Engineers, 14 pages.

* cited by examiner

MASK HAZE EARLY DETECTION

CROSS-REFERENCE TO RELATED APPLICATIONS

This application claims the benefit of commonly-assigned U.S. Patent Application No. 60/969,368, filed Aug. 31, 2007, which is hereby incorporated herein by reference.

BACKGROUND

As semiconductor device manufacturers continue to produce smaller devices, the requirements for photomasks used in the fabrication of these devices continue to tighten. Photomasks, also known as reticles or masks, typically consist of substrates that have an absorber layer formed on the substrate. The absorber layer includes a pattern representing a circuit image that may be transferred onto semiconductor wafers in a lithography system. As feature sizes of semiconductor devices decrease, the corresponding circuit images on the photomask also become smaller and more complex. Consequently, the quality of the mask has become one of the most crucial elements in establishing a robust and reliable semiconductor fabrication process.

In order to maintain the quality of the photomask throughout its lifetime, manufacturers have developed a pellicle to protect at least the patterned side of the photomask from being damaged by contaminants that may be present in semiconductor manufacturing tools. The pellicle typically includes a thin film attached to a frame, which has a height that places the thin film outside of the focal plane such that contaminants on the film are not imaged onto a semiconductor wafer.

Photomask contamination, however, may still occur under the pellicle film, as well as on the backside of the mask, during a lithography process. Organic and/or inorganic materials or chemicals used during the manufacturing processes may interact with photons to create airborne contaminants. Contaminants may also be created from material outgassing during lithography processing. Other sources of contaminants can include vaporized photoresist that is released during photoresist coating processes, evaporation of different chemicals during pre-bake and post-bake processes, solvents used on the photomask in during develop processes, and contaminants existing in the semiconductor fabrication facility ("Fab") environment.

Contaminants may also enter into the space between the pellicle film and the photomask through, for example, vent holes in the pellicle frame. Additionally, contaminants may be trapped under the pellicle film after the pellicle is mounted on the photomask. The contaminants may create a haze in the optical path associated with the photomask assembly, which can reduce the clarity of the image in the focal plane. For example, a layer of contaminants may build up on the patterned side of a photomask, which may darken and distort an image projected onto a wafer.

Thus, detecting maze haze formation is critical to maintaining satisfactory wafer yield levels. To satisfy mask haze detection requirements, a Fab can perform thousands of mask scans with each inspection tool therein. However, current inspection tools detect mask haze only after the haze has developed into a precipitate, by which time the haze may already adversely affect imaging. Moreover, mask haze detection is often performed at regular intervals that are scheduled to minimize scanning resources while maximizing throughput, but the haze formation may develop into a precipitate more quickly than such intervals, thereby impacting wafer yield. In addition, conventional haze detection scanning requires that the entire mask must be scanned, thereby consuming a relatively large amount of time and decreasing product yield. Conventional haze detection tools and methods also require substantial initial and ongoing financial expenditures.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
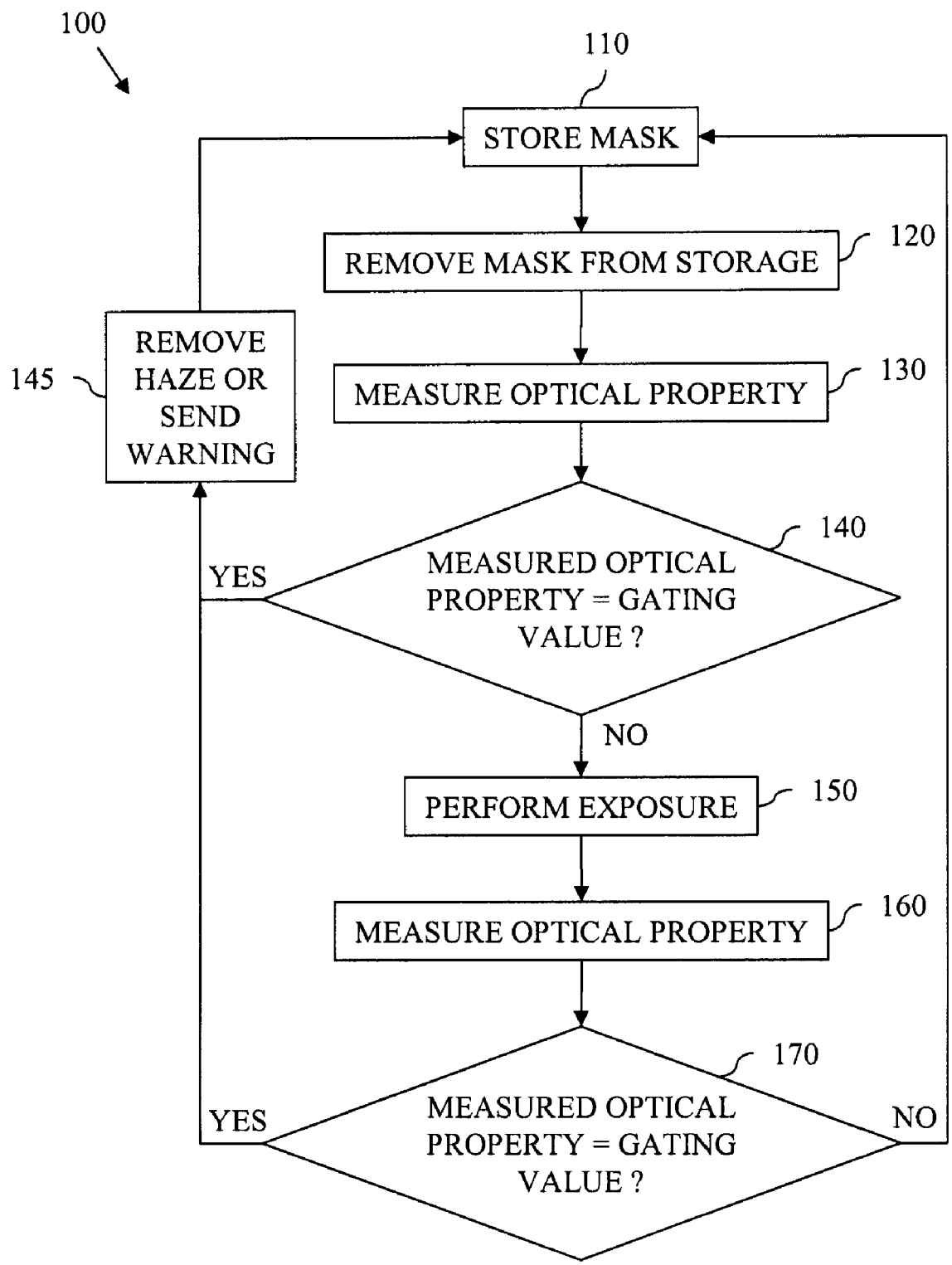
FIG. 1 is a flow-chart diagram of at least a portion of a method according to one or more aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flow-chart diagram of at least a portion of a method 100 according to one or more aspects of the present disclosure. The method 100 can be executed to detect haze formation on a photolithography mask based on one or more optical properties of a patterned feature and/or other portion of the mask. The method 100 may be easily inserted into existing semiconductor fabrication processes, and may be applicable or readily adaptable to all technology nodes.

The method 100 may include a step 110 comprising storing the mask. Such storage may be in an environmentally-controlled container in which pressure and/or temperature are controlled and the mask is protected from light, impact, shock and contaminates. The container may be purged with nitrogen and/or another inert gas. In an exemplary embodiment, the storage container may be, comprise, or be included in a conventional or future-developed overhead buffer, storage rack, mask carrier, mask transporter, load-lock, chamber, and/or other container. The mask may be placed into such storage upon arrival from a separate, mask-processing facility. Alternatively, or additionally, the mask may be placed into storage after use of the mask during an imaging process. Nonetheless, in a subsequent step 120 of the method 100, the mask is removed from storage. The processes of storing the mask in step 110 and removing the mask from storage in step 120 may be manual, automated, or a combination thereof.

After removal from storage, one or more optical properties of at least a portion of the mask are measured during a step 130. The one or more optical properties may include at least one of phase modification, transmittance, reflectance, and surface material spectra amplitude. However, additional or alternative optical properties may also be measured during step 130 or elsewhere within the method 100 within the scope of the present disclosure. Such measurement may utilize at least one of a transmittance measurement apparatus, an optical critical dimension (OCD) measurement apparatus, a Fourier transform infrared (FTIR) spectroscopy apparatus, a Raman spectroscopy apparatus, and other apparatus which can detect spectra covering the region of species capable of generating haze precipitation on the mask surface, such as sulfates, ammonium, cyanuric acid, and cyanoacritates, among others. Alternative or additional optical property measurement means, however, are also within the scope of the present disclosure.

During the measurement of step 130, an entire surface of the mask may be scanned, such that one or more optical properties of a plurality of locations on the mask surface may be obtained. A subset, average, mean, or other statistical analysis of the resulting plurality of optical property measurement data may be subsequently utilized within the method 100. In an exemplary embodiment, however, only a portion of the mask is scanned to obtain optical property measurement data. For example, the measurement performed during step 130 may only include scanning a representative number of certain patterns or patterned features of the mask, instead of scanning the entire mask. Such patterned features may include lines, spaces, contacts, contact holes, vias, dummy patterns, and/or other features of varying size and/or density, and the pattern densities thereof may range between 0% and 100%. In an exemplary embodiment, the portion of the plurality of patterned features that are scanned to obtain optical property measurements may be only between about 2% and about 50%, or otherwise less than 100% of the plurality of patterned features of the mask, such as to decrease the amount of time and resources needed for scanning.

One or more of the optical property measurements, or derivations therefrom, are subsequently compared to one or more optical property gating values in a decisional step 140. For example, a transmittance value may be measured during step 130, and this may be compared to a transmittance gating value during step 140. If the measured transmittance is equal to or less than the transmittance gating value, as determined during step 140, then the method 100 proceeds to a step 145. If it is determined during the decisional step 140 that the measured transmittance is greater than the transmittance gating value, then the method 100 proceeds to a step 150 during which the mask is utilized to perform one or more exposure processes.

Step 145 may comprise removing at least a portion of the haze formed on the mask. Alternatively, or additionally, step 145 may comprise generating and/or transmitting a warning to an operator or controller, for example, that the measured transmittance has fallen below the transmittance gating value (or that another optical property measurement, when compared to its corresponding gating value, indicates that haze formation has likely progressed a certain amount).

In an exemplary embodiment, the decisional step 140 may comprise comparing the absolute value of the difference between the measured transmittance and the transmittance gating value to a predetermined delta value, particularly where the measured transmittance may be either less than or greater than the transmittance gating value. The gating value may be a predetermined level of variance of the measured optical property value from the desired optical property value. For example, if the desired transmittance is 80%, an example transmittance gating value may represent a variation of 10 percentage points from the desired transmittance, such that if the absolute value of the difference between the measured transmittance and the desired transmittance is more than 10 percentage points (i.e., if measured transmittance is less than 70% or greater than 90%) then the method 100 proceeds to step 145, but if the absolute value of the difference between the measured transmittance and the desired transmittance is equal to or less than 10 percentage points (i.e., if the measured transmittance is between 70% and 90%) then the method 100 proceeds to step 150. Of course, this is merely an example provided to demonstrate aspects of the present disclosure, and those skilled in the art should understand that other transmittance values, absolute values, and gating values are also within the scope of the present disclosure, including as applied to measurement of other optical properties.

For example, a reflectance value may alternatively or additionally be measured during step 130, and may be subsequently compared to a reflectance gating value during step 140. If the absolute value of the difference between the measured reflectance and a predetermined reflectance is greater than the reflectance gating value, as determined during step 140, then the method 100 proceeds to step 145 where at least a portion of the haze formed on the mask is removed and/or a warning signal is generated and/or transmitted. However, if it is determined during the decisional step 140 that the absolute value of the difference between the measured reflectance and a predetermined reflectance is less than or equal to the reflectance gating value, then the method 100 proceeds to step 150 and the mask is utilized to perform one or more exposure processes.

A phase modification value may alternatively or additionally be measured during step 130, and may be subsequently compared to a phase modification gating value during step 140. If the measured phase modification is substantially different than the phase modification gating value (e.g., by at least about 10°), as determined during step 140, then the method 100 proceeds to step 145 and at least a portion of the haze formed on the mask is removed. However, if it is determined during the decisional step 140 that the measured phase modification is not substantially different than the reflectance gating value (e.g., within about 10°), then the method 100 proceeds to step 150 and the mask is utilized to perform one or more exposure processes.

A surface material spectra peak value may alternatively or additionally be measured during step 130, and may be subsequently compared to a surface material spectra peak gating value during step 140. If the measured surface material spectra peak is equal to or greater than the surface material spectra peak gating value, as determined during step 140, then the method 100 proceeds to step 145 and at least a portion of the haze formed on the mask is removed. However, if it is determined during the decisional step 140 that the measured surface material spectra peak is less than the surface material spectra peak gating value, then the method 100 proceeds to step 150 and the mask is utilized to perform one or more exposure processes.

The method 100 may also include a step 160 during which one or more optical properties of at least a portion of the mask are scanned after the exposure performed during step 150. The one or more optical properties measured during step 160 may be the same optical properties measured during step 130. For example, if transmittance is measured during step 130, then transmittance may also be measured during step 160. However, the optical property measurements performed during steps 130 and 160 may also vary within the scope of the present disclosure. In an exemplary embodiment, optical property measurements may only be obtained during one of the steps 130 and 160, such that the method 100 may include either step 130 or step 160, but not necessarily both step 130 and step 160.

After step 160, one or more of the optical property measurements obtained therein, or derivations utilizing such measurements, are compared to one or more optical property gating values in a decisional step 170 to determine whether haze formed on the mask requires removal. For example, if transmittance and/or reflectance values measured during step 160 fall below corresponding gating values, or if phase modification and/or material spectra peak values measured during step 160 exceed corresponding gate values, then the method 100 proceeds to step 145 and at least a portion of the haze formed on the mask is removed. Otherwise, the method 100 may proceed to step 110 and/or another step in the method 100, and the method 100 may be repeated in an iterative manner.

Figure 2:
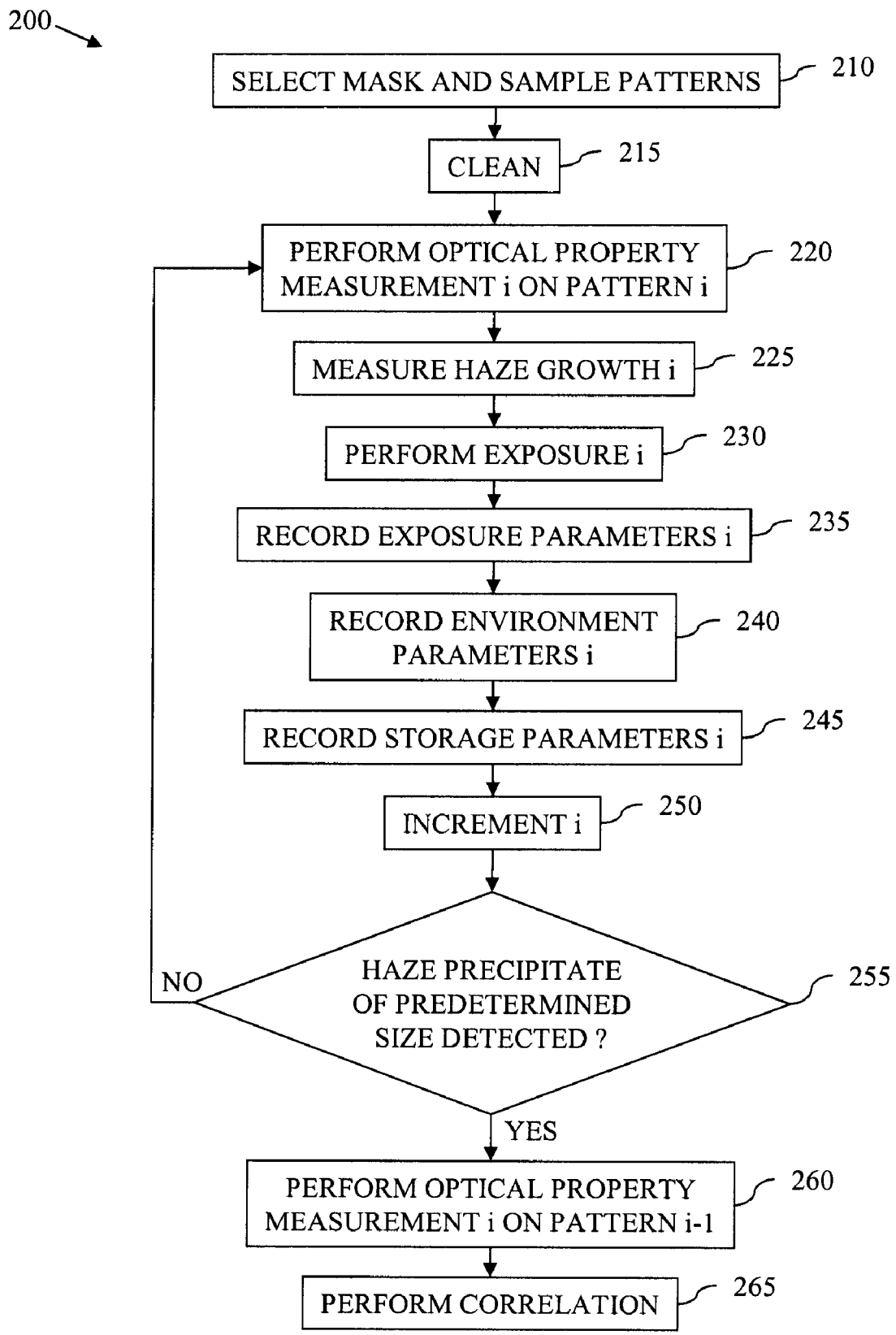
FIG. 2 is a flow-chart diagram of at least a portion of a method according to one or more aspects of the present disclosure.

Referring to FIG. 2, illustrated is a flow-chart diagram of at least a portion of a method 200 according to one or more aspects of the present disclosure. The method 200 can be executed to obtain one or more gating values for one or more optical properties of at least a portion of a mask by correlating measured optical property data with measured haze formation data. The method 200 may be performed in series, in parallel, in combination, or otherwise in conjunction with the method 100 shown in FIG. 1. In an exemplary embodiment, a method within the scope of the present disclosure includes executing the method 200 one or more times to determine one or more optical property gating values for one or more optical properties of at least a portion of a mask, and then executing the method 100 one or more times utilizing the one or more gating values to predict, detect, and/or correct haze formation on the mask. For example, an exemplary method within the scope of the present disclosure includes executing the method 200 once to initially determine a correlation and/or gating value for one or more optical properties of a mask, and then executing the method 100 multiple times utilizing the correlation and/or gating value to prevent haze formation on the mask from reaching a critical level.

The method 200 may include a step 210 comprising selecting a mask for which one or more optical property gating values are to be determined. Step 210 may also include selecting one or more patterns of the mask for scanning during a subsequent step of the method 200. The mask and/or the one or more patterns selected during step 210 may be selected based on suspected or prior knowledge of a correspondence between optical property variation and haze development. Alternatively, or additionally, the mask and/or the one or more patterns selected during step 210 may be selected based on imminent or otherwise scheduled use of the mask. For example, if the mask is scheduled for use during a particular period of Fab operation, step 210 may comprise selecting the mask 48 hours before the scheduled use, such that the mask can be processed for excessive haze formation, if necessary, prior to the scheduled use. However, as mentioned above, the method 200 may not be performed each time the mask is utilized during a lithography process.

The method 200 may also include a step 215 during which the mask and/or the one or more patterns selected during step 210 can be cleaned or otherwise processed, such as to remove excessive haze formation. In a subsequent step 220, an optical property measurement "i" is performed on a selected pattern "i", where "i" is an iterating variable utilized during the method 200. The iterating variable may be initially set equal to a value of zero or one. Thus, during the first iteration of at least this portion of the method 200, the iterating variable may indicate that the optical property of the first pattern (or feature) of the first mask selected during step 210 is to be measured. During subsequent iterations, optical properties of other patterns of the mask selected during step 210 may be measured.

The growth of haze on the selected mask may then be measured during a subsequent step 225. This haze growth will be correlated with the optical property measurement performed during step 220. Accordingly, the haze growth measurement of step 225 is also associated with the iterating variable "i". The haze growth measured during step 225 may be growth on the particular pattern (or feature) selected during step 210 and optically measured during step 220.

The mask and/or one or more patterns selected during step 210 and/or measured during step 220 may then be utilized for an imaging process during a step 230, such as by directing an exposure light towards a production substrate through the mask and/or patterns. This exposure may be correlated with the optical property measurement performed during step 220. Accordingly, the parameters of the exposure performed during step 230 may also be associated with the iterating variable "i". This exposure may additionally or alternatively be correlated with the haze growth measured during step 225, although such correlation may alternatively be based on an association between exposure parameters and subsequent haze growth.

The parameters of the exposure performed during step 230 may be recorded during a step 235, although such recording may be performed simultaneously with the exposure performed during step 230. In an exemplary embodiment, the exposure parameters may include the intensity and duration of each exposure process, although the recording of additional or alternative exposure parameters are also within the scope of the present disclosure. The exposure parameters recorded during all iterations of the method 200, and/or the exposure parameters for other processes in which the mask and/or patterns selected during step 210 are subject to a photolithographic exposure process, cumulatively form a photolithographic exposure history of the mask and/or patterns. The photolithographic exposure history of the mask and/or patterns can be utilized according to aspects of the method 100 of FIG. 1, or otherwise within the scope of the present disclosure, to be correlated with the haze growth measurements taken during step 225. In an exemplary embodiment, haze growth may be correlated with a combination of the photolithographic exposure history iteratively obtained via step 235 and the optical property measurements iteratively obtained via step 220.

The method 200 may also include a step 240 during which parameters of one or more environments associated with the iterating variable "i" of the method 200 are recorded. Such environments may include ambient environments encountered by the mask and/or patterns during any time that the mask is being transferred between storage, cleaning, optical property and haze growth measurement stations, and/or exposure apparatus. Exposure to such environments may be correlated with the optical property measurement performed during step 220. Accordingly, the parameters of the environmental exposure recorded during step 240 may also be associated with the iterating variable "i". This environmental exposure may additionally or alternatively be correlated with the haze growth measured during step 225.

The parameters of environmental exposure recorded during step 240 may be recorded during the discrete step 240, or they may be recorded simultaneously with the specific environmental exposures. In an exemplary embodiment, the environmental exposure parameters may include exposure duration, temperature, pressure, light intensity, and environmental composition (gas), although the recording of additional or alternative environmental exposure parameters are also within the scope of the present disclosure.

The environmental exposure parameters recorded during all iterations of the method 200 cumulatively form an environmental exposure history of the mask and/or patterns. The environmental exposure history of the mask and/or patterns can be utilized according to aspects of the method 100 of FIG. 1, or otherwise within the scope of the present disclosure, to be correlated with the haze growth measurements taken during step 225. In an exemplary embodiment, haze growth may be correlated with a combination of the environmental exposure history iteratively obtained via step 240, the photolithographic exposure history iteratively obtained via step 235, and/or the optical property measurements iteratively obtained via step 220.

The method 200 may also include a step 245 during which parameters of one or more storage environments associated with the iterating variable "i" of the method 200 are recorded. Such storage environments may be encountered by the mask and/or patterns during any time that the mask is housed within a storage container, such as described above with respect to step 110 of the method 100 shown in FIG. 1. Exposure to such storage environments may be correlated with the optical property measurement performed during step 220. Accordingly, the parameters of the storage recorded during step 245 may also be associated with the iterating variable "i". This storage exposure may additionally or alternatively be correlated with the haze growth measured during step 225.

The parameters of storage recorded during step 245 may be recorded during the discrete step 245, or they may be recorded simultaneously with the specific storage periods. In an exemplary embodiment, the storage exposure parameters may include storage duration, temperature, pressure, and environmental composition (gas), although the recording of additional or alternative storage parameters are also within the scope of the present disclosure.

The storage parameters recorded during all iterations of the method 200 cumulatively form a storage history of the mask and/or patterns. The storage history may also or alternatively form a portion of the environmental exposure history of the mask and/or patterns, and may likewise be utilized according to aspects of the method 100 of FIG. 1, or otherwise within the scope of the present disclosure, to be correlated with the haze growth measurements taken during step 225. In an exemplary embodiment, haze growth may be correlated with a combination of the environmental exposure history, including the storage history, the photolithographic exposure history, and/or optical property measurements.

The method 200 also includes a step 250 during which the iterating variable "i" is iterated. In a subsequent decisional step 255, execution of the method 200 is directed back to step 220 if haze precipitate of a predetermined size has been detected, such as via optical detection. For example, if haze precipitate crystals of 10 nm or larger are not detected, the next iteration of the method 200 is initiated at step 220. If haze precipitate crystals of 10 nm or larger are detected, as determined during step 255, the method 200 continues to a step 260 during which one or more final optical property measurements are performed. However, this final measurement is performed on the pattern "i−1" which has most recently been the subject of steps 220-250. That is, because the iterating variable "i−1" was iterated during step 250, prior to the optical measurement performed during step 260, the optical measurements of step 260 are associated with value "i−1" of the iterating variable so that the optical measurements can be correctly correlated.

In a subsequent step 265, the haze growth measurements obtained via the iterations of step 225 are correlated to the optical property measurements obtained via the iterations of step 220, thereby obtaining gating values corresponding to the optical property measurements. In an exemplary embodiment, such correlation also incorporates the photolithographic exposure history obtained via the iterations of steps 230 and 235, and/or the environmental exposure history obtained via the iterations of step 240. As described above, the environmental exposure history may also include storage history obtained via iterations of step 245.

The correlation performed during step 265 may further incorporate geometric attributes of the mask and/or the one or more patterns analyzed during execution of the various steps of the method 200. Such geometric attributes may include shapes, widths, lengths, pattern density, and/or other dimensional aspects of the mask and/or patterns. The correlation may further incorporate physical attributes of the mask and/or patterns, such as material/chemical composition and/or other physical characteristics.

Figure 3A:
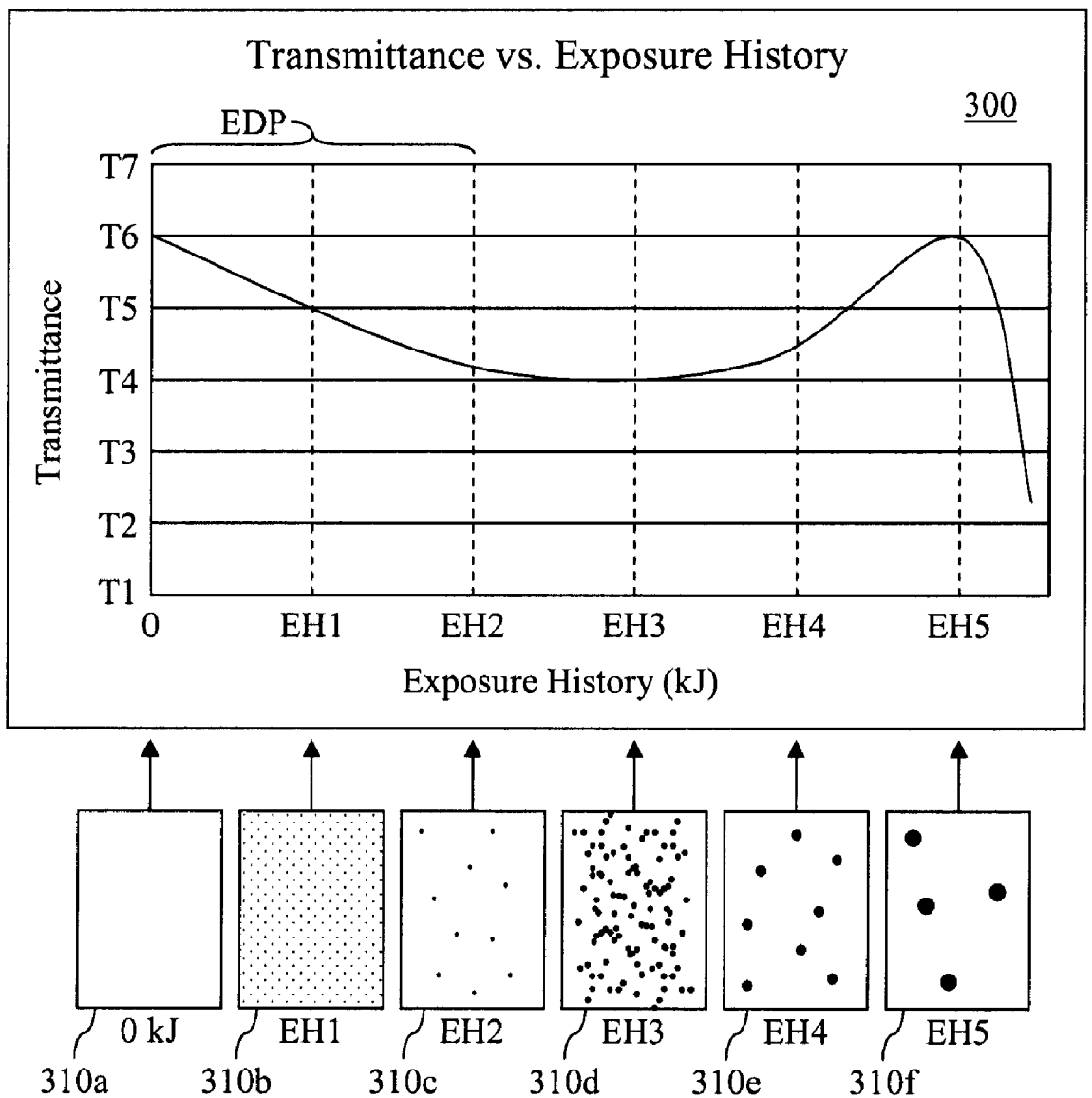
FIGS. 3A and 3B are each graphs depicting one or more aspects of the present disclosure.

Referring to FIG. 3A, illustrated is a graph 300 depicting a relationship between transmittance of a photolithographic mask and the exposure history of the mask. FIG. 3A also includes a series of images 310*a-f* each depicting exemplary haze development at various stages of an exemplary mask exposure history.

The first image 310*a* depicts the mask prior to initial photolithographic exposure. That is, the cumulative photolithographic energy to which the mask in image 310*a* has been exposed (i.e., its exposure history) is 0 kJ. Consequently, no haze has yet developed as a result of photolithographic exposure. The second image 310*b* depicts the mask after the exposure history includes a first amount of cumulative photolithographic energy, EH1. That is, the mask has been exposed to one or more exposure processes which cumulatively equal the first amount of energy, EH1. Consequently, a thin film of haze has begun to develop.

The third image 310*c* depicts the mask after the exposure history includes a second amount of cumulative photolithographic energy EH2, where the second amount of cumulative photolithographic energy EH2 is greater than the first amount of cumulative photolithographic energy EH1. The continued exposure has caused the thin film of haze to begin to precipitate, although the haze particles may remain relatively small. The fourth image 310*d* depicts the mask after the exposure history includes a third amount of cumulative photolithographic energy EH3, which has caused the haze particles to further precipitate and grow in size and number. The third amount of cumulative photolithographic energy EH3 is greater than the second amount of cumulative photolithographic energy EH2. The fifth image 310*e* depicts the mask after the exposure history includes a fourth amount of cumulative photolithographic energy EH4, which has caused the haze particles to further precipitate and combine. The fourth amount of cumulative photolithographic energy EH4 is greater than the third amount of cumulative photolithographic energy EH3. The sixth image 310*f* depicts the mask after the exposure history includes a fifth amount of cumulative photolithographic energy EH5, by which time the haze particles have combined and further grown in size. The fifth amount of cumulative photolithographic energy EH5 is greater than the fourth amount of cumulative photolithographic energy EH4.

The graph 300 in FIG. 3A depicts one possible correlation between transmittance and photolithographic exposure history of a mask. As shown therein, the transmittance of the mask is at a value T6 when the cumulative exposure energy is about 0 kJ, corresponding to image 310a. Because no haze has yet developed on the mask from using the mask during a photolithographic process, the transmittance is not yet effected. However, as the exposure history grows to EH1, corresponding to image 310b, the transmittance begins to drop because the photolithographic imaging light becomes partially impeded by the growing haze. In the exemplary embodiment shown in the graph 300 of FIG. 3A, the transmittance has dropped to a transmittance value T5, which is less than the transmittance value T6 by some amount. However, transmittance drop rates other than as depicted in FIG. 3A are also within the scope of the present disclosure.

As the exposure history grows to EH2, corresponding to image 310c, the transmittance further drops toward a transmittance value T4, which is less than the transmittance value T5 by some amount. The transmittance then levels out near the transmittance value T4 as the exposure history grows to EH3, corresponding to image 310d. As the exposure history grows to EH4, the haze film begins to precipitate and becomes less of an impedance to the photolithographic imaging light so that transmittance begins to rise, such as to between transmittance values T4 and T5. As the exposure history grows to EH5, the haze particles further combine, thereby growing in size but decreasing in number, such that the haze becomes even less of an impedance to the photolithographic imaging light. Consequently, the transmittance rises to or near transmittance value T6. However, as the exposure history grows past EH5, the larger haze particles increase in number, thereby once again blocking the photolithographic imaging light such that transmittance once again begins to drop.

It is understood that the exposure history and corresponding haze formation depicted in the images 310a-f are merely an exemplary correlation demonstrating aspects of the present disclosure. Other correlations between exposure history and haze formation are also within the scope of the present disclosure.

Conventionally, haze crystals are detectable when the reach the size of only a few nanometers (nm), and it is soon after this point in the mask's exposure history that the haze development can begin to have adverse effects on the accuracy of the image processing that subsequently utilizes the mask. This corresponds to image 310c in FIG. 3A. However, according to aspects of the present disclosure, an early detection phase (EDP) can be utilized to detect or predict haze formation, such that the mask can be replaced or processed to remove haze prior to the haze developing to a damaging level. Thus, for example, if the haze development, transmittance and/or exposure history are correlated, such as according to aspects of the method 200 shown in FIG. 2, this correlation can be utilized for early detection of haze development, such as according to aspects of the method 100 shown in FIG. 1. In the example shown in FIG. 3A, such correlation can result in obtaining a transmittance gating value of about T4 and/or a photolithographic exposure history gating value of about EH2. Accordingly, the occurrence of transmittance falling to or below this transmittance gating value of about T4, and/or the exposure history rising to or above this exposure history gating value of about EH2, may indicate that haze growth has or will soon reach a damaging level.

Figure 3B:
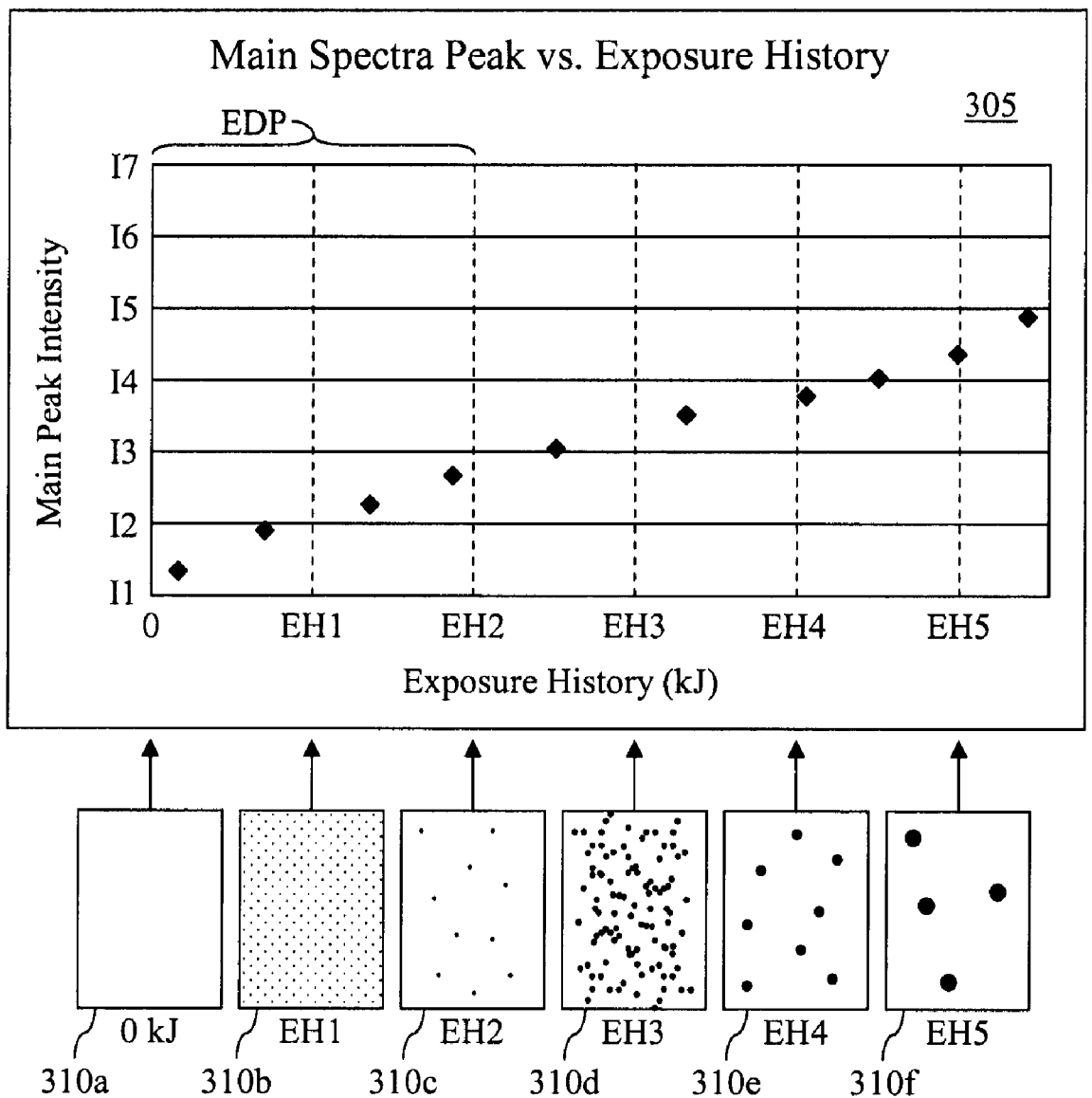

Referring to FIG. 3B, illustrated is a graph 305 depicting one possible correlation between the main spectra peak intensity of a photolithographic mask surface material and the exposure history of the mask. FIG. 3B also includes the series of images 310a-f each depicting exemplary haze development at various stages of the mask's exposure history, as described above. As shown in FIG. 3B, the main spectra peak intensity of surface material of the mask has a value of slightly more than I1 when the cumulative exposure energy is about 0 kJ, corresponding to image 310a. As the exposure history grows to EH1, corresponding to image 310b, the main spectra peak intensity rises to a value of about I2, which is greater than I1. However, the main spectra peak intensity may increase at rates other than as depicted in FIG. 3B within the scope of the present disclosure.

As the exposure history grows to about EH2, corresponding to image 310c, the main spectra peak intensity further rises to near a value I3, which is greater than I2, and then to above I3 as the exposure history grows to about EH3, corresponding to image 310d. As the exposure history grows to about EH4, the main spectra peak intensity rises to near a value I4, which is greater than I3, and then to above I4 as the exposure history grows to about EH5. As the exposure history grows past about EH5, the main spectra peak intensity will further increase towards a value I5, if not higher. The intensity value I5 is greater than the value I4.

According to aspects of the present disclosure, the early detection phase (EDP) can also be utilized to detect or predict haze formation based on a correlation between haze growth, main spectra peak, and/or exposure history. Thus, if the haze development, main spectra peak and/or exposure history are correlated, such as according to aspects of the method 200 shown in FIG. 2, this correlation can be utilized for early detection of haze development, such as according to aspects of the method 100 shown in FIG. 1. In the example shown in FIG. 3B, such correlation can result in obtaining a main spectra peak intensity gating value of near I3. Accordingly, the occurrence of main spectra peak intensity rising to or above this main spectra peak intensity gating value of near I3 may indicate that haze growth has or will soon reach a damaging level.

Figure 4:
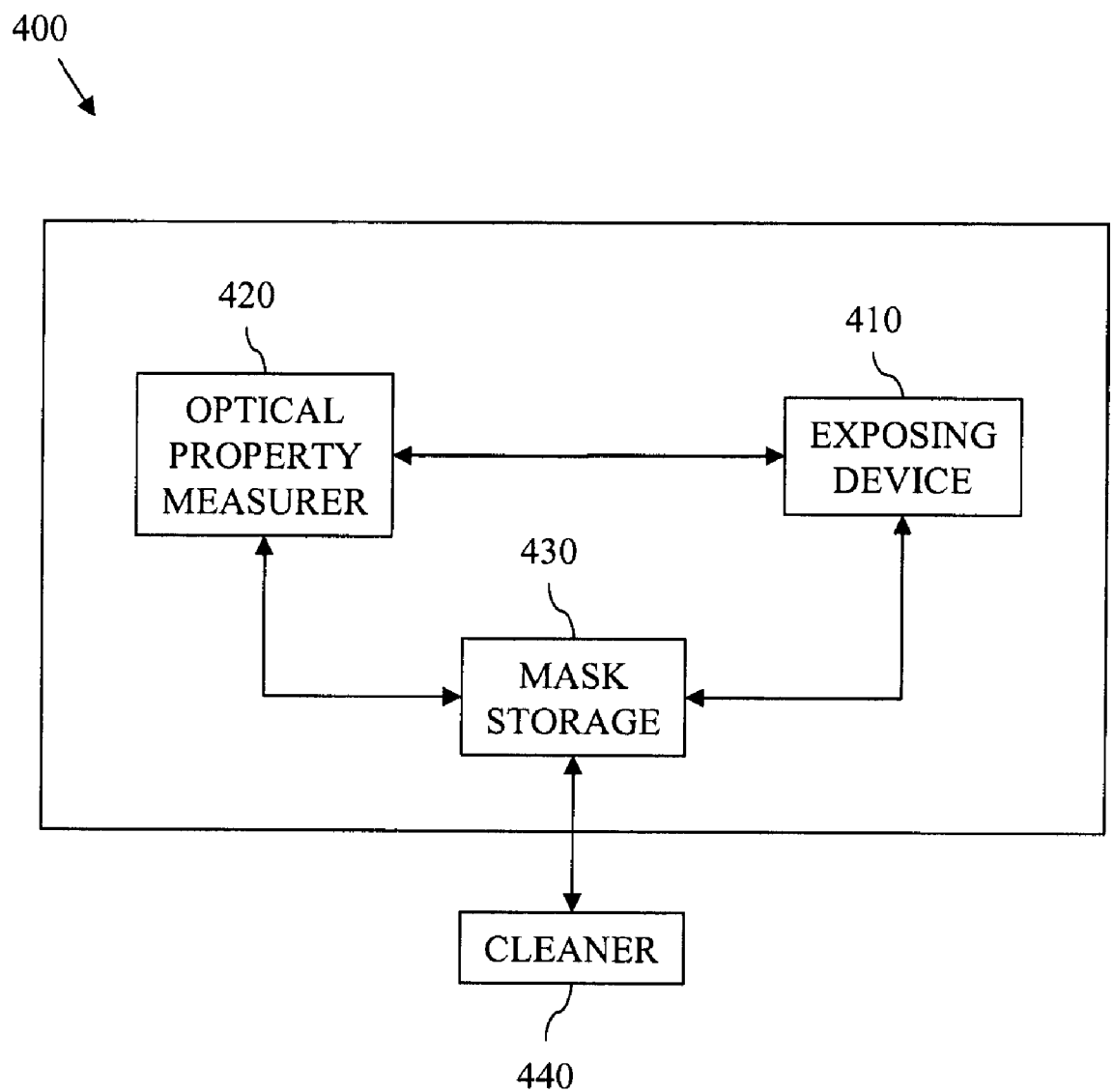
FIG. 4 is a schematic view of at least a portion of apparatus according to one or more aspects of the present disclosure.

Referring to FIG. 4, illustrated is a schematic view of at least a portion of apparatus 400 according to one or more aspects of the present disclosure. The apparatus 400 is an exemplary environment in which the method 100 of FIG. 1 and/or the method 200 of FIG. 2 may be implemented. The apparatus 400 may additionally or alternatively be utilized to perform early haze detection embodied by aspects of the graph 300 shown in FIG. 3A and/or the graph 305 shown in FIG. 3B, and/or other correlations between haze development and optical properties within the scope of the present disclosure. In an exemplary embodiment, the apparatus 400 is embodied or otherwise implemented as or within a Fab or other semiconductor production or development facility.

The apparatus 400 includes an exposing device 410 and an optical property measurer 420. The exposing device 410 may be any device, system, component, or other apparatus configured to perform photolithographic transfer of patterns from a mask to a wafer by directing a light or other imaging energy towards the wafer through at least a portion of the mask. For example, the exposing device 410 may be or comprise one or more stepper, step-and-scan, and/or other lithography components, modules, or systems.

The optical property measurer 420 may be any device, system, component, or other apparatus configured to measure optical properties of at least a portion of the mask before and/or after the mask is utilized by the exposing device 410 during one or more photolithographic processes. The optical property measurer 420 may measure at least one of phase modification, transmittance, reflectance, and material spectra amplitude, as described above. The optical property measurer 420 may be or comprise at least one of a transmittance measurement apparatus, an optical critical dimension (OCD)

measurement apparatus, a Fourier transform infrared (FTIR) spectroscopy apparatus, a Raman spectroscopy apparatus, and other apparatus which can detect spectra covering the region of species capable of generating haze precipitation on the mask surface.

A mask may be transported between the exposing device 410 and the optical property measurer 420 before and/or after the mask is utilized during a lithographic process, as indicated by the double-headed arrow in FIG. 4. Additionally, or alternatively, the mask may be transported between a mask storage apparatus 430 and one or both of the exposing device 410 and the optical property measurer 420, as also indicated by double-headed arrows in FIG. 4. The storage apparatus 430 may be included within the apparatus 400, as shown in FIG. 4. For example, the storage apparatus 430 may be an integral component of the apparatus 400, may otherwise be located within the same facility as the exposing device 410 and the optical property measurer 420, or may otherwise be associated with the apparatus 400. In an exemplary embodiment, the mask storage apparatus 430 may be substantially similar to the storage apparatus described above with reference to the storage step 110 of the method 100 shown in FIG. 1.

The apparatus 400 may further comprise a cleaner 440. However, as in the exemplary embodiment depicted in FIG. 4, the cleaner 440 may be a discrete component separate from the apparatus 400. For example, the cleaner 400 may be located in a separate Fab or other facility remote from the apparatus 400. Alternatively, the cleaner 400 may be an integral component of the apparatus 400, may otherwise be located within the same facility as the apparatus 400, or may otherwise be associated with the apparatus 400. The cleaner 400 may be any device, system, component, or other apparatus configured to at least partially remove haze which has grown on the mask.

Figure 5:
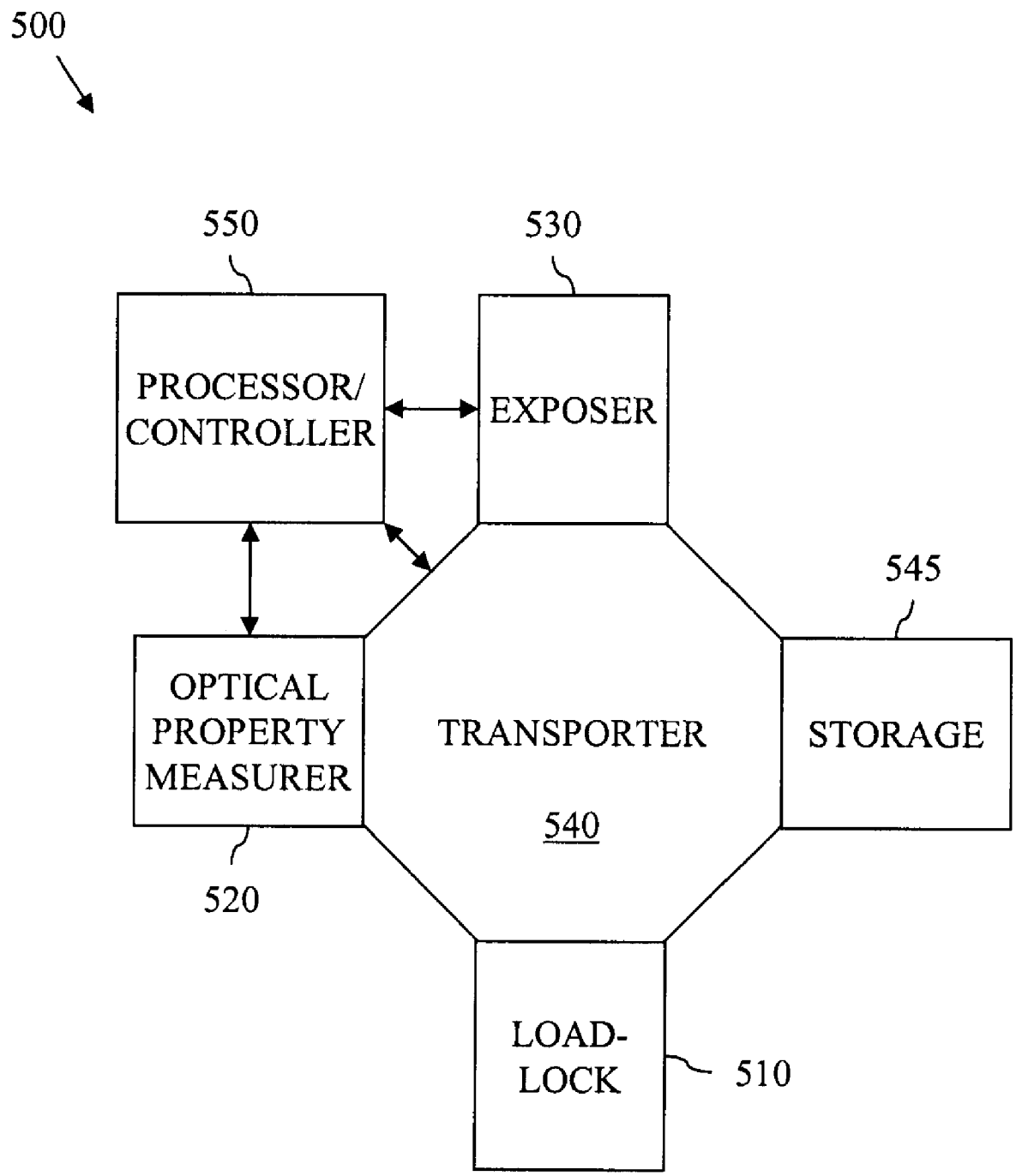
FIG. 5 is a schematic view of at least a portion of apparatus according to one or more aspects of the present disclosure.

Referring to FIG. 5, illustrated is a schematic view of at least a portion of apparatus 500 according to one or more aspects of the present disclosure. The apparatus 500 is an exemplary environment in which the method 100 of FIG. 1 and/or the method 200 of FIG. 2 may be implemented. The apparatus 500 may additionally or alternatively be utilized to perform early haze detection embodied by aspects of the graph 300 shown in FIG. 3A and/or the graph 305 shown in FIG. 3B, and/or other correlations between haze development and optical properties within the scope of the present disclosure. In an exemplary embodiment, the apparatus 500 is embodied or otherwise implemented as a mask fabrication cluster tool.

The apparatus 500 includes a load-lock chamber 510, an optical property measurer chamber 520, an exposing chamber 530, and a transporter 540. The load-lock chamber 510 is configured for transferring mask masks into and out of the apparatus 500.

The optical property measurer chamber 520 is configured to obtain optical property measurements of at least a portion of a mask. The optical property measurer chamber 520 may measure at least one of phase modification, transmittance, reflectance, and material spectra amplitude, as described above. The optical property measurer chamber 520 may be or comprise at least one of a transmittance measurement apparatus, an optical critical dimension (OCD) measurement apparatus, a Fourier transform infrared (FTIR) spectroscopy apparatus, a Raman spectroscopy apparatus, and other apparatus which can detect spectra covering the region of species capable of generating haze precipitation on the mask surface. Other aspects of the optical property measurer chamber 520 may be substantially similar or identical to the optical property measurers and/or optical property measuring apparatus described above or otherwise within the scope of the present disclosure.

The exposing chamber 530 is configured to perform photolithographic transfer of patterns from the mask to a wafer by directing a light or other imaging energy towards the wafer through at least a portion of the mask. Other aspects of the exposing chamber 530 may be substantially similar or identical to the exposure and/or imaging apparatus described above or otherwise within the scope of the present disclosure. The transporter 540 is configured to transport masks between the load-lock chamber 510, the optical property measurer chamber 520, and the exposing chamber 530. Such transport may be manual and/or automated.

The apparatus 500 may also comprise a storage chamber 545. The storage chamber 545 may be configured to store a mask between processes performed within the load-lock chamber 510, the optical property measurer chamber 520, and the exposing chamber 530. The storage chamber 545 may be configured to maintain the mask in a predetermined storage environment, such as an ambient substantially comprising nitrogen and/or other inert gases. In an exemplary embodiment, the mask storage chamber 545 may be substantially similar to the storage apparatus described above with reference to the storage step 110 of the method 100 shown in FIG. 1.

The apparatus 500 may also comprise or be electrically connected with one or more modules 550 configured for control of the chambers and/or transporter of the apparatus 500 and/or data processing associated therewith, as indicated by the double-headed arrows shown in FIG. 5. For example, the one or more modules 550 may be configured to control the movement of the transporter 540 during the transfer of masks between the chambers of the apparatus 500. The one or more modules 550 may be alternatively or additionally configured to control the opening and closing of the load-lock chamber 510. The one or more modules 550 may be alternatively or additionally configured to control the optical property measurements performed by the optical property measurer chamber 520. The one or more modules 550 may be alternatively or additionally configured to control the imaging performed by the exposing chamber 530, such as controlling the exposure energy, intensity, duration, and/or other exposure parameters.

The one or more modules 550 may be alternatively or additionally configured to receive data from the optical property measurer chamber 520 to record the optical property measurements obtained therein. The one or more modules 550 may be alternatively or additionally configured to receive data from the exposing chamber 530 to record the lithography exposure history associated with a particular mask. The one or more modules 550 may be alternatively or additionally configured to receive data indicative of a particular mask's environmental exposure history, storage exposure history, mask/pattern geometric data, mask/pattern physical data, and/or other information which can be correlated to haze growth, as described above. The one or more modules 550 may be alternatively or additionally configured to process data to determine optical property gating values, such as according to one or more aspects of the method 200 shown in FIG. 2. The one or more modules 550 may be alternatively or additionally configured to process data to perform early haze detection, such as according to one or more aspects of the method 100 shown in FIG. 1.

In view of all of the above and the Figures, it should be readily apparent to those skilled in the art that the present disclosure introduces a method of detecting haze formation on a mask, the method comprising obtaining an optical property of the mask and then determining progress of the haze formation based on the obtained optical property. The method may further comprise, in response to a change in the optical property which is sufficient to satisfy a predetermined condition, at least one of removing at least a portion of the haze from the mask and transmitting a warning message. At least one of the removing and the transmitting may be triggered by the change in the optical property during a stage in the haze formation that is prior to precipitation of the haze. The optical property may be selected from the group consisting of: phase modification by at least a portion of the mask; transmittance of at least a portion of the mask; reflectance of at least a portion of the mask; and material spectra amplitude of at least a portion of the mask. The method may further comprise removing at least a portion of the haze from the mask in response to a value of the optical property equaling a predetermined value. The predetermined value may be correlated to a stage in the haze formation that is prior to precipitation of the haze. Determining the progress of the haze formation may be further based on at least one of: a photolithographic exposure history of at least a portion of the mask; an environment history of at least a portion of the mask; a geometric characteristic of at least a portion of the mask; and a composition characteristic of at least a portion of the mask. The photolithographic exposure history may comprise intensity and duration levels for all photolithographic exposures applied to the mask during a preceding period. The environment history may comprise temperature, pressure and ambient environment composition levels encountered by the mask during a preceding period. The preceding period may commence with a most recent haze removal process performed on the mask or the initial fabrication of the mask. Obtaining the optical property of the mask may utilize an apparatus selected from the group consisting of: a transmittance measurement apparatus; an optical critical dimension (OCD) measurement apparatus; a Fourier transform infrared (FTIR) spectroscopy apparatus; and a Raman spectroscopy apparatus. The mask may comprise a plurality of patterned features formed on the mask, and obtaining an optical property of the mask may comprise scanning only a portion of the plurality of patterned features to obtain corresponding optical properties of the portion of the plurality of patterned features. Scanning only a portion of the plurality of patterned features may comprise scanning less than about 100% of the plurality of patterned features to obtain corresponding optical properties thereof.

The present disclosure also introduces a method for early detection of haze formation on a photolithographic mask, comprising obtaining an optical property gating value by obtaining a plurality of values of an optical property at least a portion of the mask, wherein each of the plurality of optical property values corresponds to one of a plurality of iterations of a series of steps that comprises: exposing at least the portion of the mask to photolithographic energy; exposing the mask to an ambient environment; and storing the mask in a storage environment. A plurality of haze formation data each corresponding to one of the plurality of optical property values is also obtained. The method also includes correlating the haze formation to the plurality of optical property values, wherein the optical property gating value is equal to one of the plurality of optical property values corresponding with a predetermined stage of the haze formation. The method may further comprise cleaning the mask prior to obtaining the optical property gating value. The method may further comprise removing at least a portion of the haze formation and/or transmitting a warning, and obtaining a plurality of additional optical property values each corresponding to one of a plurality of additional iterations of the series of steps until one of the plurality of additional optical property values equals the optical property gating value. The predetermined stage of haze formation may be prior to the formation of haze precipitation crystals which are detectable by a mask defect detection tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of detecting haze formation on a mask, comprising:
    obtaining data relating to an optical property of the mask, wherein the obtaining comprises:
        exposing at least a portion of the mask to photolithographic energy;
        exposing the mask to an ambient environment; and
        storing the mask in a storage environment;
    obtaining haze formation data corresponding to the obtained data relating to the optical property; and
    determining progress of the haze formation based on the obtained data relating to the optical property.

2. The method of claim 1 further comprising, in response to a change in the optical property that is sufficient to satisfy a predetermined condition, at least one of:
    removing at least a portion of the haze from the mask; and
    transmitting a warning message.

3. The method of claim 2 wherein at least one of the removing and the transmitting is triggered by the change in the optical property during a stage in the haze formation that is prior to precipitation of the haze.

4. The method of claim 1 wherein the optical property is selected from the group consisting of:
    phase modification by the at least a portion of the mask;
    transmittance of the at least a portion of the mask;
    reflectance of the at least a portion of the mask; and
    material spectra amplitude of the at least a portion of the mask.

5. The method of claim 4 further comprising removing at least a portion of the haze from the mask in response to a value of the optical property equaling a predetermined value.

6. The method of claim 5 wherein the predetermined value is correlated to a stage in the haze formation that is prior to precipitation of the haze.

7. The method of claim 1 wherein determining the progress of the haze formation is further based on at least one of:
    a photolithographic exposure history of the at least a portion of the mask;
    an environment history of the at least a portion of the mask;
    a geometric characteristic of the at least a portion of the mask; and
    a composition characteristic of the at least a portion of the mask.

8. The method of claim 7 wherein the photolithographic exposure history comprises intensity and duration levels for all photolithographic exposures applied to the mask during a preceding period.

9. The method of claim 8 wherein the preceding period commences with a most recent haze removal process performed on the mask.

10. The method of claim 8 wherein the preceding period commences with the initial fabrication of the mask.

11. The method of claim 7 wherein the environment history comprises temperature, pressure and ambient environment composition levels encountered by the mask during a preceding period.

12. The method of claim 11 wherein the preceding period commences with a most recent haze removal process performed on the mask.

13. The method of claim 11 wherein the preceding period commences with the initial fabrication of the mask.

14. The method of claim 1 wherein obtaining the data relating to the optical property of the mask utilizes an apparatus selected from the group consisting of:
   a transmittance measurement apparatus;
   an optical critical dimension (OCD) measurement apparatus;
   a Fourier transform infrared (FTIR) spectroscopy apparatus; and
   a Raman spectroscopy apparatus.

15. The method of claim 1 wherein the mask comprises a plurality of patterned features formed on the mask, and wherein obtaining the data relating to the optical property of the mask comprises scanning only a portion of the plurality of patterned features to obtain corresponding optical properties of the portion of the plurality of patterned features.

16. The method of claim 15 wherein scanning only a portion of the plurality of patterned features comprises scanning less than about 100% of the plurality of patterned features to obtain corresponding optical properties thereof.

17. A method for early detection of haze formation on a photolithographic mask, comprising:
   obtaining an optical property gating value by:
      obtaining a plurality of values of an optical property of at least a portion of the mask, wherein each of the plurality of optical property values corresponds to one of a plurality of iterations of a series of steps that comprises:
         exposing at least the portion of the mask to photolithographic energy;
         exposing the mask to an ambient environment; and
         storing the mask in a storage environment;
      obtaining a plurality of haze formation data each corresponding to one of the plurality of optical property values; and
      correlating the haze formation to the plurality of optical property values, wherein the optical property gating value is equal to one of the plurality of optical property values corresponding to a predetermined stage of the haze formation.

18. The method of claim 17 further comprising cleaning the mask prior to obtaining the optical property gating value.

19. The method of claim 17 further comprising:
   at least one of:
      removing at least a portion of the haze formation; and
      transmitting a warning; and
   obtaining a plurality of additional optical property values each corresponding to one of a plurality of additional iterations of the series of steps until one of the plurality of additional optical property values equals the optical property gating value.

20. The method of claim 17 wherein the predetermined stage of haze formation is prior to a formation of haze precipitation crystals which are detectable by a mask defect detection tool.

\* \* \* \* \*